United States Patent
Hirabayashi et al.

(10) Patent No.: US 12,089,499 B2
(45) Date of Patent: Sep. 10, 2024

(54) ACTUATOR, LIQUID DISCHARGE HEAD, LIQUID DISCHARGE DEVICE, AND LIQUID DISCHARGE APPARATUS

(71) Applicants: Takuma Hirabayashi, Tokyo (JP); Takahiko Kuroda, Hyogo (JP); Akio Yoshita, Kanagawa (JP)

(72) Inventors: Takuma Hirabayashi, Tokyo (JP); Takahiko Kuroda, Hyogo (JP); Akio Yoshita, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 132 days.

(21) Appl. No.: 18/052,207

(22) Filed: Nov. 3, 2022

(65) Prior Publication Data

US 2023/0157177 A1     May 18, 2023

(30) Foreign Application Priority Data

Nov. 16, 2021    (JP) ................. 2021-186491

(51) Int. Cl.
*B41J 2/14*     (2006.01)
*H10N 30/20*     (2023.01)

(52) U.S. Cl.
CPC .......... *H10N 30/20* (2023.02); *B41J 2/14201* (2013.01)

(58) Field of Classification Search
CPC ....................................................... B41J 2/14
See application file for complete search history.

(56) References Cited

U.S. PATENT DOCUMENTS

| | | |
|---|---|---|
| 2017/0306471 A1 | 10/2017 | Abe et al. |
| 2018/0117915 A1 | 5/2018 | Takeuchi et al. |
| 2020/0031113 A1 | 1/2020 | Kondo et al. |
| 2020/0298570 A1 | 9/2020 | Masuda et al. |
| 2020/0316939 A1* | 10/2020 | Mizuno .................. B41J 2/1433 |
| 2022/0242123 A1 | 8/2022 | Hirabayashi et al. |

FOREIGN PATENT DOCUMENTS

| | | | |
|---|---|---|---|
| JP | 2006-224672 | | 8/2006 |
| JP | 2012-192707 | | 10/2012 |
| JP | 2015-128831 | | 7/2015 |
| JP | 2016-168804 | | 9/2016 |
| JP | 2020-151899 | | 9/2020 |
| JP | 2020168734 A | * | 10/2020 .......... B41J 2/14233 |
| JP | 2020168811 A | * | 10/2020 .......... B41J 2/14032 |

OTHER PUBLICATIONS

Yamamoto, MachineTranslationofJP-2020168734-A, 2020 (Year: 2020).*
Mizuno,MachineTranslationofJP-2020168811-A, 2020 (Year: 2020).*

* cited by examiner

*Primary Examiner* — Scott A Richmond
(74) *Attorney, Agent, or Firm* — XSENSUS LLP

(57) ABSTRACT

An actuator includes: a frame having a recess; an actuator substrate including a common chamber; a damper between the frame and the actuator substrate, the damper defining a part of a wall of the common chamber of the actuator substrate. The damper includes multiple layers laminated in a lamination direction, and the multiple layers is symmetrical in the lamination direction with respect to a center of the damper in the lamination direction.

14 Claims, 5 Drawing Sheets

US 12,089,499 B2

ACTUATOR, LIQUID DISCHARGE HEAD, LIQUID DISCHARGE DEVICE, AND LIQUID DISCHARGE APPARATUS

CROSS-REFERENCE TO RELATED APPLICATIONS

This patent application is based on and claims priority pursuant to 35 U.S.C. § 119(a) to Japanese Patent Application No. 2021-186491, filed on Nov. 16, 2021, in the Japan Patent Office, the entire disclosure of which is hereby incorporated by reference herein.

BACKGROUND

Technical Field

The present embodiment relates to an actuator, a liquid discharge head, a liquid discharge device, and a liquid discharge apparatus.

Related Art

A liquid discharge head that discharges liquid employs a damper including a Si-based membrane formed by a semiconductor process.

The liquid discharge head is provided with a damper including a deformable damper that forms a part of a wall surface of a common chamber. The damper is provided with a thick portion that increases in thickness toward an end part of the common chamber in a longitudinal direction. It is possible to improve the ability for discharging air bubbles from the common chamber.

An inkjet printhead employing a piezoelectric method includes an intermediate substrate formed with multiple dampers that penetrate the intermediate substrate at positions corresponding to the other end parts of multiple pressure chambers. It is possible to reduce crosstalk during the discharge of ink. The intermediate substrate is provided with a damping membrane that alleviates changes in the internal pressure of a manifold, and a cavity is formed below the damping membrane. The damping membrane is formed by thinning a part of a Si substrate that forms the intermediate substrate.

SUMMARY

An actuator includes: a frame having a recess; an actuator substrate including a common chamber; a damper between the frame and the actuator substrate, the damper defining a part of a wall of the common chamber of the actuator substrate. The damper includes multiple layers laminated in a lamination direction, and the multiple layers is symmetrical in the lamination direction with respect to a center of the damper in the lamination direction.

BRIEF DESCRIPTION OF THE DRAWINGS

A more complete appreciation of embodiments of the present disclosure and many of the attendant advantages and features thereof can be readily obtained and understood from the following detailed description with reference to the accompanying drawings, wherein.

Figure 1:
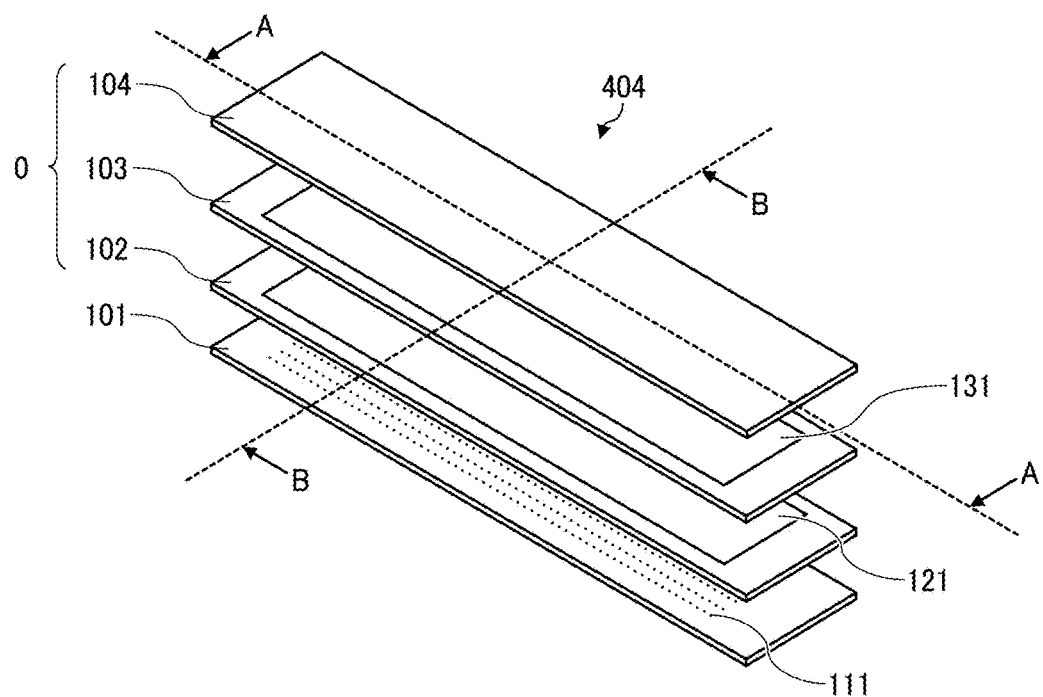
FIG. 1 is an exploded perspective, schematic view for explaining an example of a damper and a liquid discharge head according to the present embodiment.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an," and "the" are intended to include the plural forms as well, unless the context clearly indicates otherwise.

A damper 103, an actuator 106, a liquid discharge head 404, a liquid discharge device 440, and a liquid discharge apparatus 500 according to the present embodiment are described below with reference to the drawings. The present embodiment is not limited to the embodiment indicated below, and changes such as other embodiments, additions, modifications, omissions, and the like are possible within the scope that is conceivable for a person skilled in the art. All of these changed configurations are also included in the scope of the present embodiment, as long as an action or an effect of the present embodiment is exhibited.

The damper of the present embodiment is a damper to be bonded to a frame having a recess and an actuator substrate including a common chamber. The damper includes a damper forming a part of a wall surface of the common chamber when the damper is bonded to the actuator substrate. The damper has a laminated structure including multiple layers and is symmetrical in a lamination direction, with respect to a center in the lamination direction.

The recess provided in the frame may be referred to as a cavity or the like. The damper may be referred to as a membrane or the like.

The liquid discharge head of the present embodiment includes the damper of the present embodiment, and additionally includes the frame, the actuator substrate, a nozzle substrate, and the like. In the present embodiment, the damper and the frame may form an integrated damper.

FIG. 1 illustrates a view for explaining the damper and the liquid discharge head 404 according to the present embodiment.

FIG. 1 is a view for schematically explaining an exploded perspective view of the liquid discharge head of the present embodiment. The liquid discharge head 404 of the present embodiment includes a nozzle substrate 101, an actuator substrate 102, a damper 103, and a frame 104. The actuator 106 includes the actuator substrate 102, the damper 103, and the frame 104. The liquid discharge head 404 includes the actuator 106 and the nozzle substrate 101.

The nozzle substrate 101 includes a nozzle 111 that discharges a liquid (for example, ink).

The actuator substrate 102 includes a common chamber 121 and is bonded to the nozzle substrate 101 and the damper 103. The common chamber 121 is illustrated schematically in FIG. 1, and is not limited to the common chamber illustrated in FIG. 1.

The frame 104 includes a recess, which will be described later, and is bonded to the damper 103.

The damper 103 is bonded to the frame 104 and the actuator substrate 102. A bonding method may be appropriately selected, as described later.

The damper 103 includes a damper 131 that forms a part of a wall surface of the common chamber 121 when the damper 103 is bonded to the actuator substrate 102. The shape of the damper 131 is illustrated schematically in FIG. 1, and is not limited to the illustrated shape.

Employing the damper 103 makes it possible to use vibration of the damper 131 to dampen vibration of the liquid. For example, employing the damper 103 makes it possible to dampen vibration of the liquid flowing through channel branches (channels) formed on the actuator substrate 102. In addition, it is possible to reduce propagation of a vibration generated in one channel (a channel is defined as one nozzle unit) to another channel.

Figure 2:
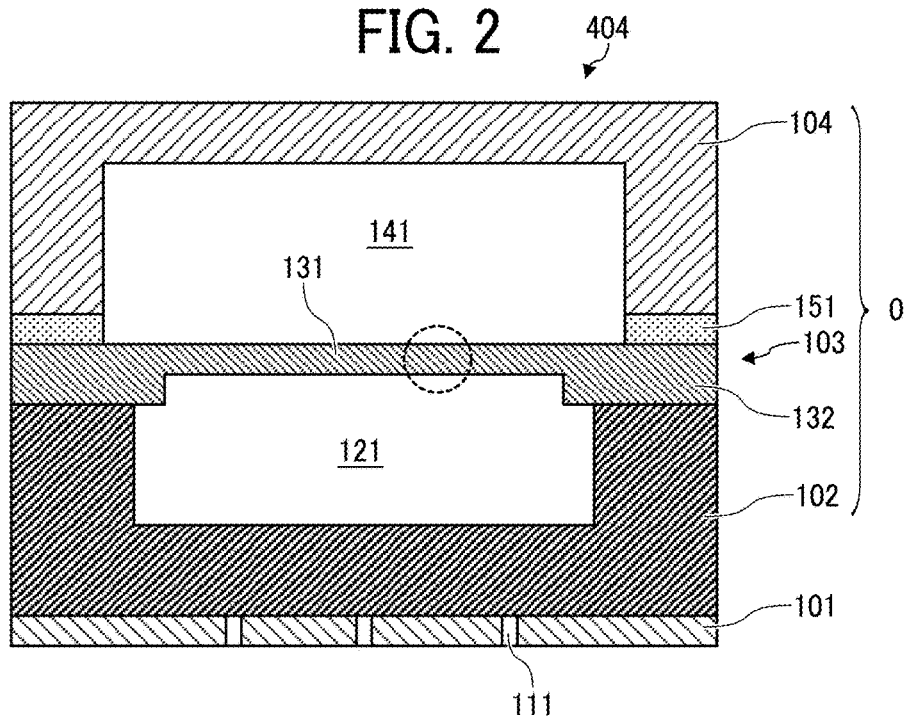
FIG. 2 is a schematic, cross-sectional view for explaining an example of the damper and the liquid discharge head according to the present embodiment.
Figure 3:
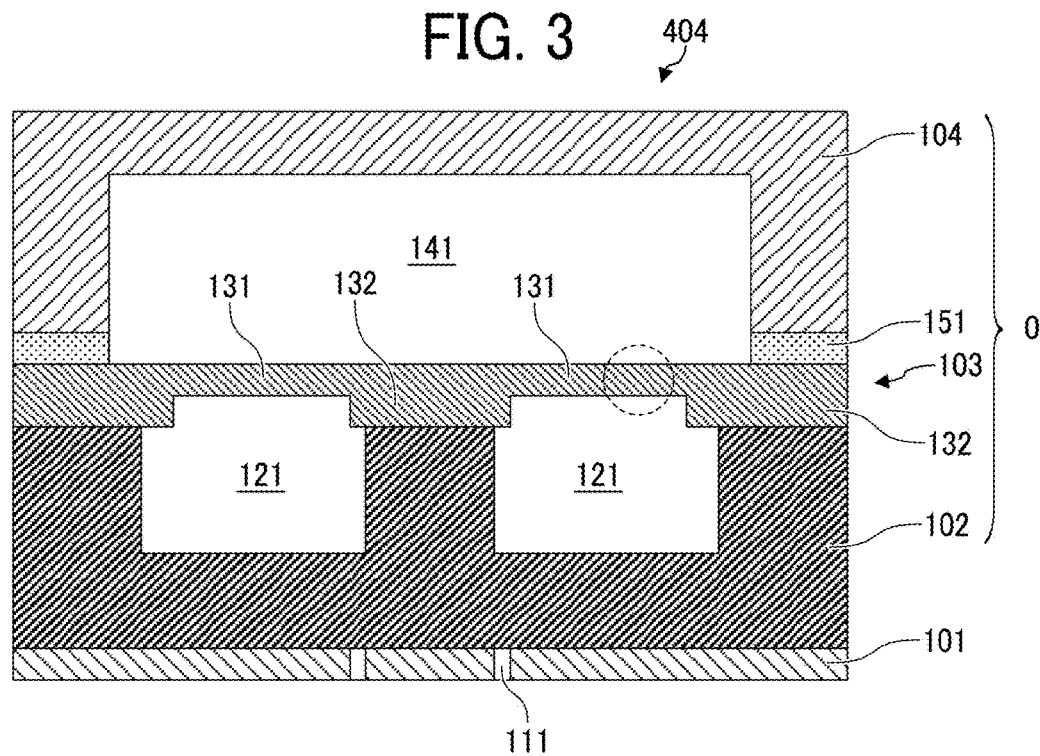
FIG. 3 is a schematic, cross-sectional view for explaining an example of the damper and the liquid discharge head according to the present embodiment.

Next, FIGS. 2 and 3 are views for explaining the damper of the present embodiment.

FIG. 2 is a schematic, cross-sectional view along a nozzle arrangement direction of the liquid discharge head of the present embodiment, and corresponds to a schematic, cross-sectional view taken along a line AA in FIG. 1.

FIG. 3 is a schematic, cross-sectional view in a direction perpendicular to the nozzle arrangement direction of the liquid discharge head of the present embodiment, and corresponds to a schematic, cross-sectional view along a line BB in FIG. 1.

As illustrated in the drawings, the frame 104 includes a recess 141. By providing the recess 141, the damper 131 can be prevented from contacting the frame 104, when the damper 131 is deformed, for example. The recess 141 may also be referred to as a cavity, a damper region, a damper chamber, and the like.

In the examples illustrated in FIGS. 2 and 3, the frame 104 and the damper 103 are bonded by an adhesive 151, but any other bonding methods may be used.

The actuator substrate 102 includes the common chamber 121, and when the damper 103 is bonded to the actuator substrate 102, the damper 131 forms a part of the wall surface of the common chamber 121. For example, when the liquid in the common chamber 121 vibrates, the damper 131 can also vibrate to dampen the vibration of the liquid. It is possible to alleviate propagation of pressure to adjacent channels and fluctuations in the ink flow rate. For example, fluctuations of the pressure in the liquid chamber and the channels in the actuator substrate 102 can be alleviated.

For example, the damper 103 includes the damper 131 and a peripheral thick part 132. The peripheral thick part 132 is a part to be bonded to the actuator substrate 102. The peripheral thick part 132 is provided to improve a bonding performance between the damper 103 and the actuator substrate 102 or the frame 104. However, the peripheral thick part 132 may not be provided.

In the illustrated example, only the common chamber 121 is illustrated in the actuator substrate 102, but the actuator substrate 102 may also include individual chambers, a piezoelectric element, channels, and the like. For example, the individual chambers communicate with the nozzle 111 provided in the nozzle substrate 101. The shape, the arrangement, and the number of the nozzles 111 are not limited to the shape, the arrangement, and the number of the nozzles illustrated in the figures, and can be appropriately selected.

Figure 4:
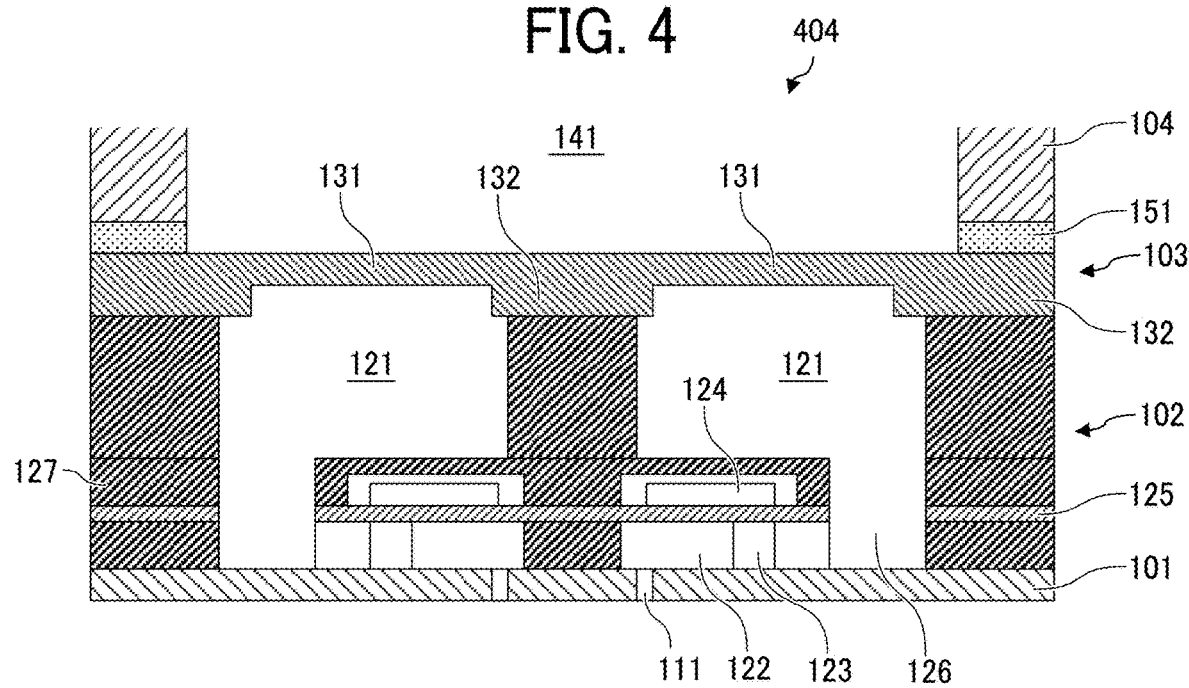
FIG. 4 is a schematic, cross-sectional view for explaining an example of a damper according to the present embodiment.

FIG. 4 illustrates another view for explaining the damper of the present embodiment.

FIG. 4 is a schematic cross-sectional view for explaining the actuator substrate 102 of FIG. 3.

As illustrated in FIG. 4, the actuator substrate 102 includes, for example, a diaphragm 125 and a channel plate 127. The actuator substrate 102 includes an individual chamber 122 communicating with the nozzle 111, and also includes a liquid restrictor 123, a piezoelectric element 124 (pressure generator), a channel 126, and the like. In addition, an introduction channel is provided between the channel 126 and the liquid restrictor 123 to introduce a liquid from the channel 126 (common channel) to the liquid restrictor 123. In the present example, the piezoelectric element 124 applies pressure to the liquid in the individual chamber 122 to discharge the liquid through the nozzle 111. The liquid is supplied to the individual chambers 122 from the common chamber 121 via the channel 126.

Next, a detailed example of the damper in the present embodiment will be described.

In the present embodiment, the damper has a laminated structure including multiple layers and is symmetrical in a lamination direction, with respect to the center in the lamination direction.

The damper having the laminated structure including the multiple layers makes it possible to easily control the physical properties of the damper. For example, the type (material) and thickness of each layer can be appropriately selected, and the number of layers can be appropriately selected. If the damper is formed by a single layer, it is not possible to change physical properties that are dependent on the type of film. On the other hand, in the damper having the laminated structure, the stress and the like may be unevenly distributed, and thus the damper may fail to function as a damper. Therefore, in the present embodiment, the damper has a laminated structure including multiple layers, and is symmetrical in the lamination direction, with respect to the center in the lamination direction.

Thus, an uneven distribution of the stress and the like can be reduced, while securing an advantage of increasing the degree of freedom in the physical properties of the damper.

Also, by designing the damper symmetrically with respect to the center in the lamination direction, it is easier to control a film stress and a center of rigidity of the damper. According to the present embodiment, the damper can be deformed with the same amount of deformation for both negative pressure and positive pressure in the vibration of the liquid, and can be deformed linearly, and thus vibration can be efficiently dampened.

Figure 5:
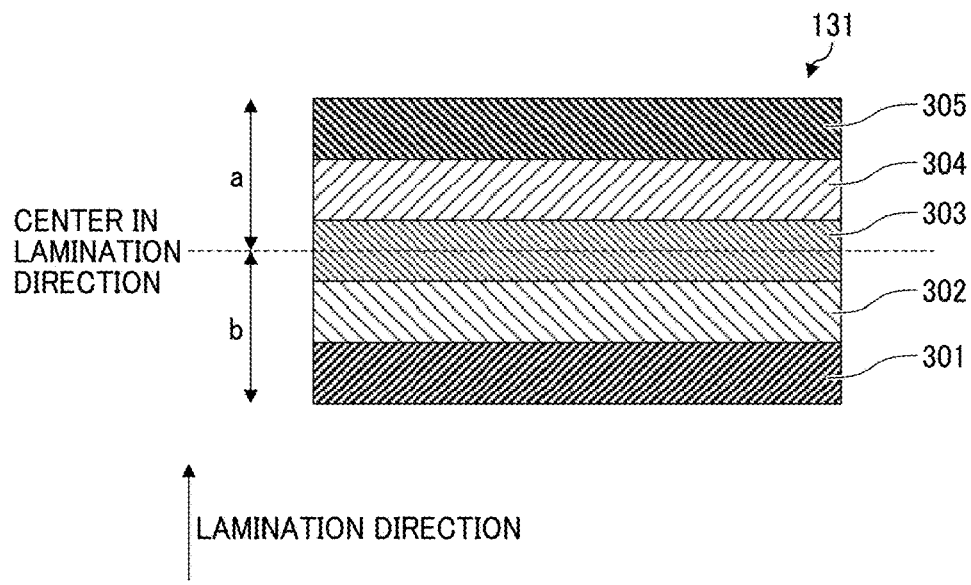
FIG. 5 is another schematic, cross-sectional view for explaining an example of the damper and the liquid discharge head according to the present embodiment.

An example of the laminated structure of the damper is illustrated in FIG. 5.

FIG. 5 is a schematic cross-sectional view of a circular portion indicated by a dashed line in FIGS. 2 and 3.

In the illustrated example, the laminated structure has a five-layer structure including a first layer 301 to a fifth layer 305 in this order from a lower side in the lamination direction. A dashed line in FIG. 5 indicates the center in the lamination direction.

In the present example, the first layer 301 and the fifth layer 305 are made of $SiO_2$, the second layer 302 and the fourth layer 304 are made of polysilicon (Poly-Si), and the third layer 303 is made of SiN. That is, the corresponding layers with respect to the center in the lamination direction are formed of the same material and components.

The thickness of each layer can be appropriately selected, but the corresponding layers with respect to the center in the lamination direction have the same thickness. For example, the first layer 301 and the fifth layer 305 have the same thickness, and the second layer 302 and the fourth layer 304 have the same thickness.

For example, when an upper portion of the laminated structure is referred to as an upper layer and a lower portion is referred to as a lower layer with respect to the center in the lamination direction, a thickness a of the upper layer and a thickness b of the lower layer are the same. It can also be said that the center in the lamination direction is a half point (½ point) of the total thickness of the damper 131.

Thus, the damper 131 in the present embodiment is symmetrical in the lamination direction, with respect to the center in the lamination direction.

The material of each layer, the number of layers, and the like are not limited to the material, the number of layers, and the like described above, and can be appropriately changed.

For example, the illustrated example has a five-layer laminated structure, but the present embodiment is not limited thereto, and the number of layers may be three or another number.

The damper has the laminated structure including the multiple layers, and thus, it is possible to adjust the material of each layer, the thickness of each layer, and the like, and freely design the physical properties of the entire film. Thus, the degree of freedom in the physical properties of the film can be increased, and it is easier to choose a layer configuration that is optimal for the function of the damper.

The damper preferably has an elastic compliance of $7\times10^{-17}$ $Pa^{-1}$ or more. To fully exhibit the function of the damper, it is preferable to adjust the elastic compliance to fall within a suitable range. If the elastic compliance of the damper is within the above-described range, it is easier to choose a layer configuration that is optimal for the function of the damper.

The elastic compliance of the damper is determined by the film thickness and the Young's modulus of the damper, when the dimensions of the channel branches through which the liquid flows are unchanged. The Young's modulus of the damper is not limited, but is preferably 3 GPa or more and 200 GPa or less. In this case, it is easier to obtain an elastic compliance of the damper that is within the above-described preferable range, and the propagation of vibrations in the liquid can be further reduced.

The damper preferably has a thickness of 2 μm or more and 10 μm or less. In this case, it is easier to obtain an elastic compliance of the damper that is within the above-described preferable range, and the propagation of vibrations in the liquid can be further reduced.

To fully exhibit the function of the damper, it is also preferable to adjust the film stress to fall within a suitable range. The damper preferably has a film stress of −200 MPa or more and 200 MPa or less. If the tensile stress is too strong, the damper may break, and if the compressive stress is too strong, the damper may buckle and form wrinkles. When the film stress is within the above-described range, the damper is prevented from breaking and it is possible to maintain the shape of the damper. Thus, the propagation of vibrations in the liquid can be further reduced.

The suitable range of the film stress of the damper can also be appropriately changed by selection of the type of material for each layer. For example, in the case of a laminated structure including $SiO_2$, SiN, and polysilicon (Poly-Si), the damper breaks at 300 MPa, and at about −100 MPa, the damper can withstand practical use, but starts to buckle. Taking the above into consideration, it is preferable that the film stress of the damper is −200 MPa or more and 200 MPa or less, which is a range where breakage, buckling, and the like of the damper can be prevented. Even if a non-ductile, brittle material is used, the film stress of the damper is preferably −200 MPa or more and 200 MPa or less.

The material forming the layers can be appropriately selected, and examples thereof include Si, polysilicon (Poly-Si), SiN, $SiO_2$, and $Al_2O_3$. By using the materials mentioned above, the elastic compliance, the film stress, and the Young's modulus can be easily set within the preferred ranges described above. In addition to the materials mentioned above, an organic material using vapor deposition or spin coating can also be used.

Next, the integrated damper of the present embodiment will be described.

The present embodiment provides an integrated damper including a frame and the damper according to the present embodiment, and in the integrated damper, the frame and the damper are bonded together.

Figure 6A:
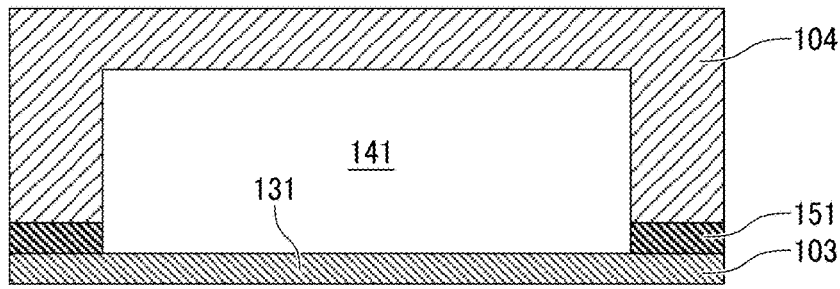
FIGS. 6A to 6C are schematic, cross-sectional views for explaining examples of an integrated damper according to the present embodiment.
Figure 6B:
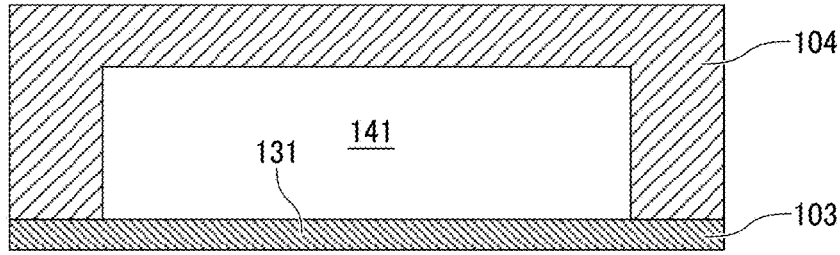
Figure 6C:
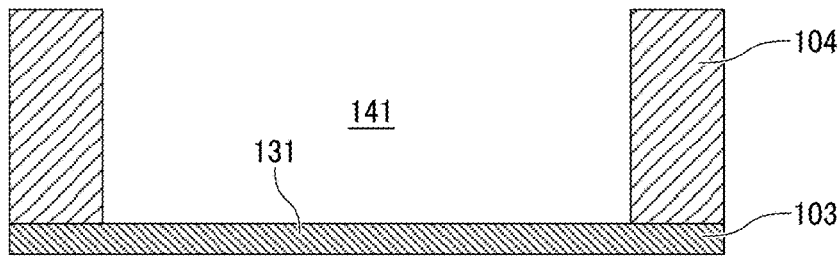

Examples of the integrated damper of the present embodiment are illustrated in FIGS. 6A to 6C. The integrated damper can be manufactured by employing a semiconductor process to form the damper and the frame as an integrated unit, for example.

In the integrated damper illustrated in FIG. 6A, the frame 104 and the damper 103 are bonded with the adhesive 151. The integrated damper can be manufactured, for example, by attaching a wafer on which the damper 131 being a multilayer film is formed, to the frame 104 with an adhesive 151 and removing a substrate portion of the wafer.

The substrate portion may also be regarded as a portion other than a portion corresponding to the frame 104, for example. In addition, if the damper 131 has the same area as the frame 104, in other words, if the damper 131 is formed at the same location as the frame 104, the substrate portion may also be regarded as a location other than the damper 131.

In the integrated damper illustrated in FIG. 6B, the frame 104 and the damper 103 are directly bonded. The integrated damper can be manufactured, for example, by attaching a wafer on which the damper 131 being a multilayer film is formed, to the frame 104 by integral bonding and removing the substrate portion.

Two types of bonding that can be used are adhesive bonding and direct bonding.

The direct bonding includes bonding by pressurization and the like and bonding by film formation.

In FIGS. 6A and 6B, the damper 103 and the frame 104 are manufactured separately and then bonded together. In this case, the method for forming the recess 141 of the frame 104 can be appropriately selected, and the recess 141 can be formed by a method such as etching using a sacrificial layer.

In the integrated damper illustrated in FIG. 6C, the frame 104 and the damper 103 are formed as an integrated unit. The integrated damper can be manufactured, for example, by forming, as an integrated unit, the frame 104 and a wafer on which the damper 131 being a multilayer film is formed, and then, removing a portion of the frame 104 to form the recess 141. Thus, the integrated damper of the present embodiment can also be manufactured by directly forming a damper on a single wafer.

In the case of the integrated damper illustrated in FIG. 6C, a ceiling portion of the recess 141 is removed to form the recess 141. Such a recess having no ceiling portion can also be referred to as the recess, but is preferably referred to as a damper region or the like.

(Liquid Discharge Apparatus and Liquid Discharge Device)

Next, an example of a liquid discharge apparatus 500 according to the present embodiment will be described with reference to FIGS. 7 and 8.

Figure 7:
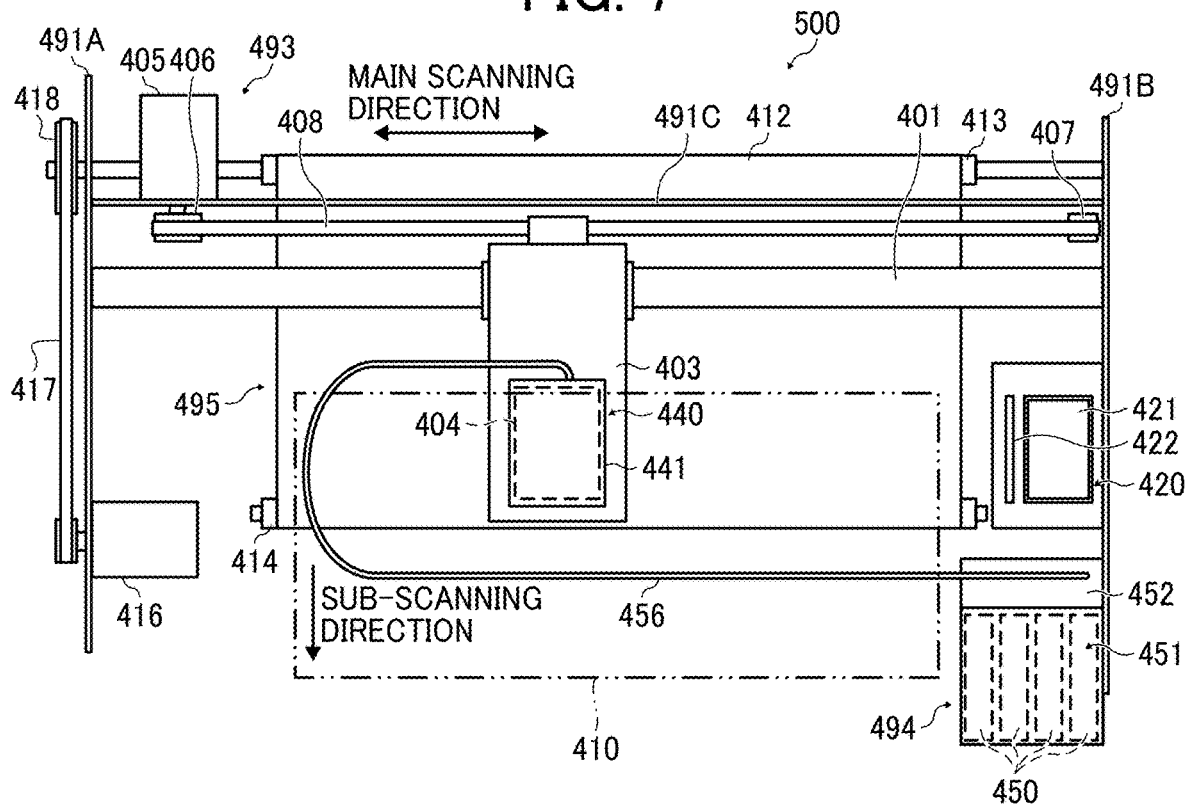
FIG. 7 is a schematic view of an example of a liquid discharge apparatus.

FIG. 7 is an explanatory plan view of main parts of the liquid discharge apparatus 500.

Figure 8:
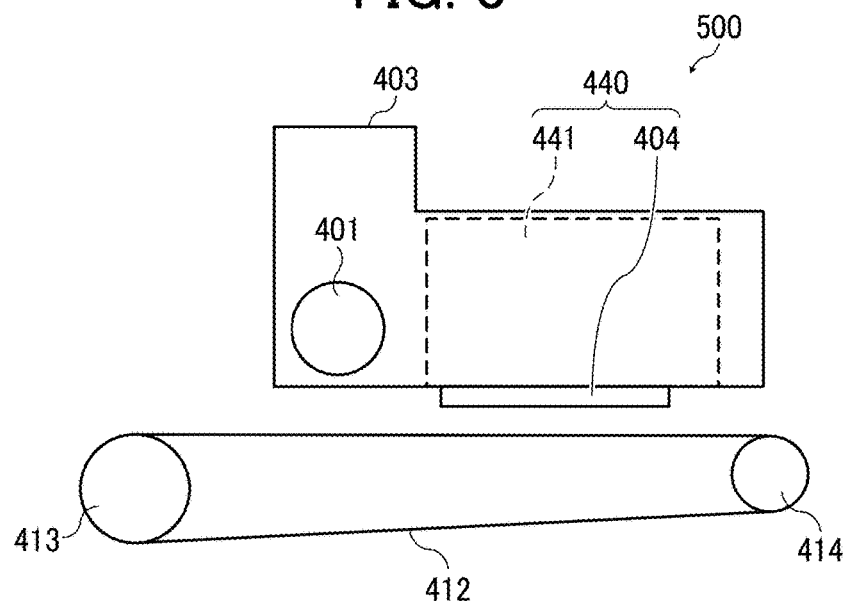
FIG. 8 is a schematic view of another example of the liquid discharge apparatus.

FIG. 8 is an explanatory side view of main parts of the liquid discharge apparatus 500.

The liquid discharge apparatus 500 is a serial type apparatus to discharge a liquid. The liquid discharge apparatus 500 includes a main scan movement mechanism 493 reciprocally moves a carriage 403 in a main scanning direction. The main scan movement mechanism 493 includes a guide member 401, a main scan motor 405, a timing belt 408, and the like. The guide member 401 is bridged between a left-side plate 491A and a right-side plate 491B and moveably holds the carriage 403. The main scan motor 405 reciprocally moves the carriage 403 in the main scanning direction via the timing belt 408 looped over a drive pulley 406 and a driven pulley 407.

The carriage 403 is mounted with a liquid discharge device 440 which is an integrated unit including a liquid discharge head 404 and a head tank 441 according to the present embodiment. The liquid discharge head 404 of the liquid discharge device 440 discharges liquid of each color, for example, yellow (Y), cyan (C), magenta (M), and black (K). In the liquid discharge head 404, a nozzle array including multiple nozzles is arranged in a sub-scanning direction perpendicular to the main scanning direction, and the liquid discharge head 404 is mounted so that the liquid is discharged downward.

A supply mechanism 494 which supplies the liquids stored outside the liquid discharge head 404 to the liquid discharge head 404 supplies the liquids stored in liquid cartridges 450 to the head tank 441.

The supply mechanism 494 includes a cartridge holder 451 serving as a filling part to which the liquid cartridges 450 are mounted, a tube 456, a liquid feed unit 452 including a liquid feed pump, and the like. The liquid cartridges 450 are detachably mounted to the cartridge holder 451. The liquids are fed from the liquid cartridges 450 to the head tank 441 by the liquid feeding unit 452 via the tube 456.

The liquid discharge apparatus 500 includes a conveyance mechanism 495 that conveys a sheet 410. The conveyance mechanism 495 includes a conveyance belt 412 as a conveyor and a sub scan motor 416 that drives the conveyance belt 412.

The conveyance belt 412 attracts the sheet 410 and conveys the sheet 410 to a position facing the liquid discharge head 404. The conveyance belt 412 is an endless belt looped over a conveyance roller 413 and a tension roller 414. The sheet 410 may be attracted to the conveyance belt 412 by electrostatic attraction, air suction, or the like.

The conveyance belt 412 moves circularly in the sub-scanning direction, as the conveyance roller 413 is rotationally driven by the sub scan motor 416 via a timing belt 417 and a timing pulley 418.

At one side in the main scanning direction of the carriage 403, a maintenance mechanism 420 that maintains the liquid discharge head 404 in good condition is disposed laterally to the conveyance belt 412.

The maintenance mechanism 420 includes, for example, a cap member 421 that caps a nozzle surface (a surface where the nozzle is formed) of the liquid discharge head 404, a wiper member 422 that wipes the nozzle surface, and the like.

The main scan movement mechanism 493, the supply mechanism 494, the maintenance mechanism 420, and the conveyance mechanism 495 are attached to a housing that includes the left-side plate 491A and the right-side plate 491B, and a rear plate 491C.

In the liquid discharge apparatus 500 thus configured, the sheet 410 is fed and attracted to the conveyance belt 412 and the sheet 410 is conveyed in the sub-scanning direction by the circular movement of the conveyance belt 412.

While the carriage 403 moves in the main scanning direction, the liquid discharge head 404 is driven in response to an image signal to discharge the liquid to the sheet 410 being stopped to form an image on the sheet 410.

As described above, the liquid discharge apparatus 500 including the liquid discharge head according to the present embodiment can stably form a high-quality image.

Next, another example of the liquid discharge device 440 according to the present embodiment will be described with reference to FIG. 9.

Figure 9:
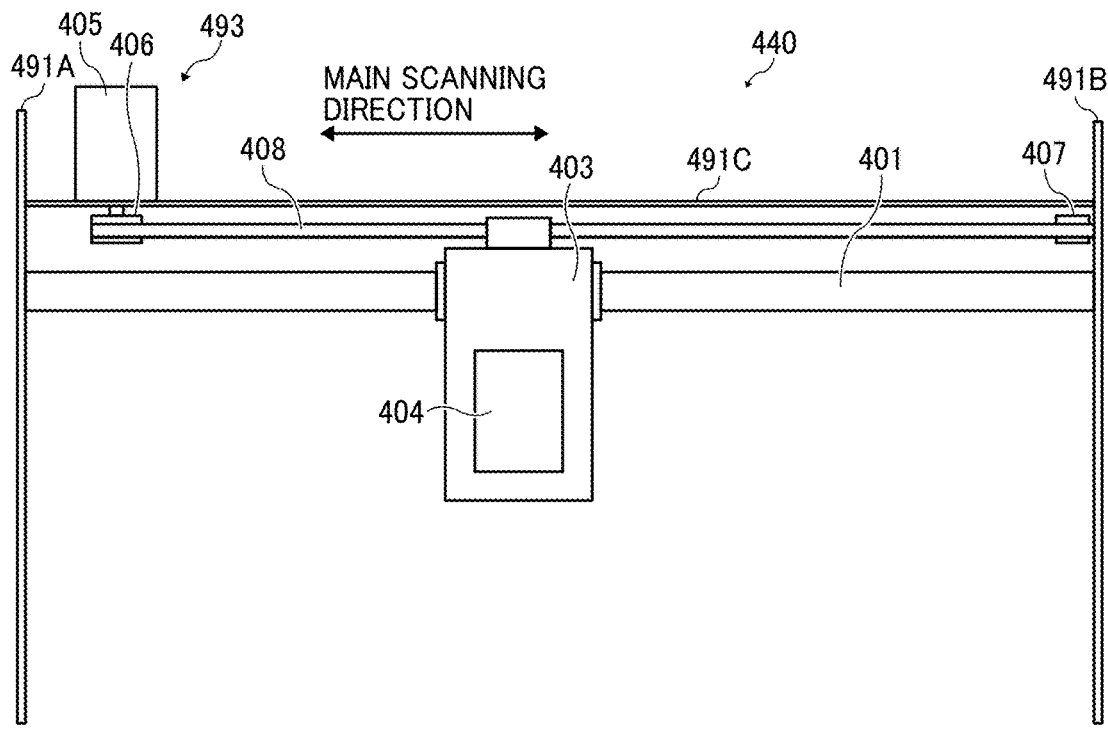
FIG. 9 is a schematic view of an example of a liquid discharge device.

FIG. 9 is an explanatory plan view of main parts of the liquid discharge device 440.

The liquid discharge device 440 includes a portion of housing, which includes the left-side plate 491A and the right-side plate 491B and the rear plate 491C, the main scan movement mechanism 493, the carriage 403, and the liquid discharge head 404, among members included in the liquid discharge apparatus 500.

The liquid discharge device 440 440 may further include at least one of the above-described maintenance mechanism 420 and the supply mechanism 494, which is attached to, for example, the right-side plate 491B of the liquid discharge device 440.

Next, still another example of the liquid discharge device 440 according to the present embodiment will be described with reference to FIG. 10.

Figure 10:
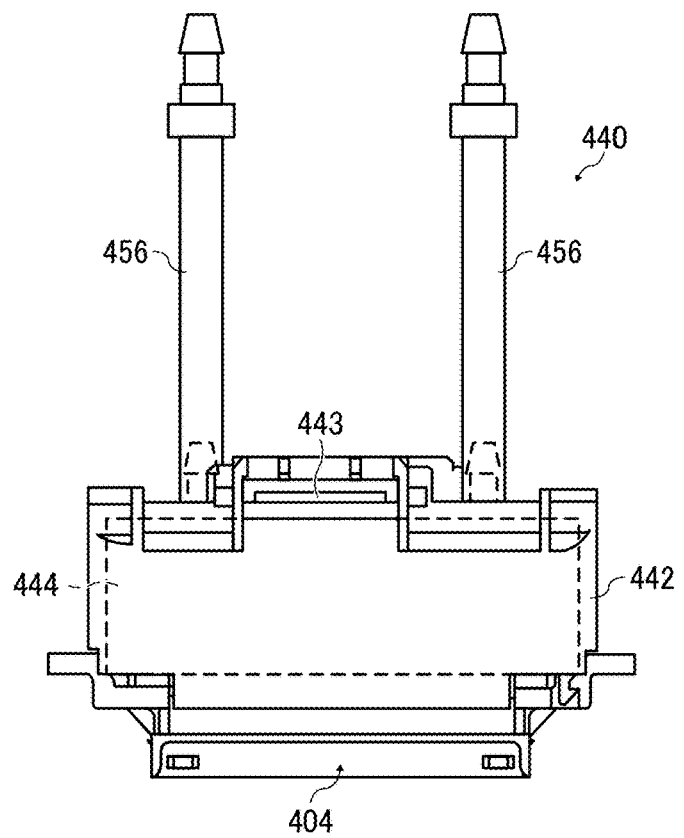
FIG. 10 is a schematic view of another example of a liquid discharge device.

FIG. 10 is a front view of the liquid discharge device 440.

The liquid discharge device 440 includes the liquid discharge head 404 to which a channel component 444 is attached and the tube 456 connected to the channel component 444.

The channel component 444 is arranged inside a cover 442. Instead of the channel component 444, the liquid discharge device 440 may include the head tank 441. A connector 443 to be electrically connected to the liquid discharge head 404 is provided at an upper part of the channel component 444.

As used herein, the term "liquid discharge apparatus" means an apparatus which includes the liquid discharge head or the liquid discharge device and drives the liquid discharge head to discharge a liquid.

The liquid discharge apparatus may not be limited to an apparatus to discharge a liquid onto an object onto which liquid can adhere but also an apparatus to discharge a liquid toward gas or into a liquid.

The "liquid discharge apparatus" may include units that feeds, conveys, and ejects the object onto which liquid can adhere, and may further include a pretreatment apparatus and a post-treatment apparatus.

For example, the "liquid discharge apparatus" may be an image forming apparatus that discharges ink to form an image on a sheet, or a stereoscopic fabrication apparatus (three-dimensional fabrication apparatus) that discharges a fabrication liquid onto a powder layer in which powder material is formed in layers to form a stereoscopic fabricated object (three-dimensional fabricated object).

The "liquid discharge apparatus" is not limited to a liquid discharge apparatus to visualize meaningful images, such as letters or figures. For example, the liquid discharge apparatus also includes an apparatus for forming arbitrary patterns and images, or an apparatus for fabricating three-dimensional images.

The term "object onto which liquid can adhere" means an object onto which liquid can adhere at least temporarily, and includes an object onto which liquid is adhered and fixed, and an object onto which liquid is adhered and into which the liquid permeates. Specific examples of the "object onto which liquid can adhere" include recording media such as a paper sheet, a recording paper, a recording sheet, a film, and a cloth, electronic components such as an electronic substrate and a piezoelectric element, and media such as a powder layer (powder material layer), an organ model, and a testing cell. The "object onto which liquid can adhere" includes any object onto which liquid can adhere, unless particularly limited.

Examples of the material of the "object onto which liquid can adhere" include any materials onto which liquid can adhere even temporarily, such as paper, thread, fiber, fabric, leather, metal, plastic, glass, wood, ceramic, construction materials such as wallpaper and floor material, and textiles for clothing.

Examples of the "liquid" include ink, treatment liquid, DNA samples, resists, pattern material, binders, fabrication liquid, and solutions or liquid dispersions containing amino acid, proteins, or calcium.

The "liquid discharge apparatus" may be an apparatus in which the liquid discharge head and the object onto which liquid can adhere are relatively moved. However, the liquid discharge apparatus is not limited to such an apparatus. More specifically, the liquid discharge apparatus may be a serial type apparatus that moves the liquid discharge head or a line type apparatus that does not move the liquid discharge head.

Examples of the "liquid discharge apparatus" further include a treatment liquid coating apparatus that discharges a treatment liquid onto a sheet to coat a surface of the sheet with the treatment liquid with the aim of reforming the surface of the sheet, and an injection granulation apparatus that discharges a composition liquid obtained by dispersing a raw material in a solution, from a nozzle to produce fine particles of the raw material.

The "liquid discharge device" is an integrated unit including the liquid discharge head and a functional component or a mechanism, and is an assembly of components relating to liquid discharge. For example, the "liquid discharge device" includes a combination of the liquid discharge head with at least one of a head tank, a carriage, a supply mechanism, a maintenance mechanism, and a main scan movement mechanism.

Here, the term "integrated" means, for example, securing the liquid discharge head and the functional component or the mechanism to each other by, e.g., fastening, bonding, or engaging, and holding one of the liquid discharge head and the functional component or the mechanism movably to the other. The liquid discharge head and the functional component or the mechanism may be detachably attached to each other.

For example, the liquid discharge device may be a unit in which the liquid discharge head and the head tank are integrated, as in the liquid discharge device 440 illustrated in FIG. 8. Alternatively, the liquid discharge device may be a unit in which the liquid discharge head and the head tank are integrated by being connected to each other by a tube or the like. A unit including a filter may be added at a position between the head tank and the liquid discharge head of the liquid discharge device.

In another example, the liquid discharge device may be a unit in which the liquid discharge head and the carriage are integrated.

In still another example, the liquid discharge device may be a unit in which the liquid discharge head and the main scan movement mechanism are integrated, and the liquid discharge head is movably held by a guide member that forms a part of the main scan movement mechanism. In still another example, as illustrated in FIG. 9, the liquid discharge device may be a unit in which the liquid discharge head, the carriage, and the main scan movement mechanism are integrated.

In still another example, the liquid discharge device may be a unit in which the liquid discharge head, the carriage, and the maintenance mechanism are integrated, and a cap member that forms a part of the maintenance mechanism is secured to the carriage to which the liquid discharge head is attached.

In still another example, as illustrated in FIG. 10, the liquid discharge device may be a unit in which the liquid discharge head and the supply mechanism are integrated, and the tube is connected to the liquid discharge head to which the head tank or the channel component is attached.

The main scan movement mechanism may include a guide member only. The supply mechanism may include a tube or a loading unit only.

The pressure generator used in the "liquid discharge head" is not limited to a particular type of pressure generator. The pressure generator is not limited to the piezoelectric actuator (or a laminated-type piezoelectric element) described in the above-described embodiment, and may be, for example, a thermal actuator that employs a thermoelectric transducer element such as a heating resistor, or an electrostatic actuator including a diaphragm and opposed electrodes.

The terms "image formation", "recording", "character printing", "image printing", "printing", and "fabrication" used herein may be used synonymously with each other.

[Aspect 1]

An actuator (106) includes: a frame (104) having a recess (141); an actuator substrate (102) including a common chamber (121); a damper (103) between the frame (104) and the actuator substrate (102), the damper (103) defining a part of a wall of the common chamber (121) of the actuator substrate (102), wherein the damper (131) includes multiple layers laminated in a lamination direction, and the multiple layers is symmetrical in the lamination direction with respect to a center of the damper (131) in the lamination direction.

[Aspect 2]

In the actuator (106) according to Aspect 1, the damper (131) has an elastic compliance of $7\times10^{-17}$ $Pa^{-1}$ or more.

[Aspect 3]

In the actuator (106) according to Aspect 1, the damper (131) has a Young's modulus of 3 GPa or more and 200 GPa or less.

[Aspect 4]

In the actuator (106) according to Aspect 1, the damper (131) has a film stress of −200 MPa or more and 200 MPa or less.

[Aspect 5]

In the actuator (106) according to Aspect 1, the damper (131) has a thickness of 2 µm or more and 10 µm or less.

[Aspect 6]

In the actuator (106) according to Aspect 1, materials of the multiple layers of the damper (131) are selected from Si, Poly-Si, SiN, $SiO_2$, and $Al_2O_3$.

[Aspect 7]

In the actuator (106) according to Aspect 1, the frame (104) and the damper (103) are bonded together.

[Aspect 8]

In the actuator (106) according to Aspect 1, corresponding layers of the multiple layers with respect to the center in the lamination direction are formed of the same material and components.

[Aspect 9]

In the actuator (106) according to Aspect 1, corresponding layers of the multiple layers with respect to the center in the lamination direction have the same thickness.

[Aspect 9]

In the actuator (106) according to Aspect 1, a first thickness of an upper layer of the multiple layers is the same as a second thickness of a lower layer of the multiple layers, where the upper layer is an upper portion of the multiple layers with respect to the center in the lamination direction, and the lower layer is a lower portion of the multiple layers with respect to the center in the lamination direction.

[Aspect 10]

A liquid discharge head (404) includes the actuator according to Aspect 1; and a nozzle substrate (101) bonded to the actuator substrate (102), the nozzle substrate (101) including a nozzle (111), and the actuator substrate (102) includes an individual chamber (122) communicating with the nozzle (111) and the common chamber (121).

[Aspect 12]

A liquid discharge device (440) includes the liquid discharge head (404) according to Aspect 11.

[Aspect 13]

In the liquid discharge device (440) according to Aspect 12, further includes at least one of: a head tank (441) storing a liquid to be supplied to the liquid discharge head (404); a carriage (403) on which the liquid discharge head (404) is mounted; a supply mechanism (494) configured to supply the liquid to the liquid discharge head (404); a maintenance mechanism (420) configured to maintain the liquid discharge head (404); or a main scanning movement mechanism (493) configured to move the liquid discharge head (404) in a main scanning direction, combined together with the liquid discharge head (404) to form a single body.

[Aspect 14]

A liquid discharge apparatus (404) includes the liquid discharge device (440) according to Aspect 12.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. An actuator comprising:
a frame having a recess;
an actuator substrate including a common chamber; and
a damper between the frame and the actuator substrate, the damper defining a part of a wall of the common chamber of the actuator substrate,
wherein the damper includes multiple layers laminated in a lamination direction, and
the multiple layers is symmetrical in the lamination direction with respect to a center of the damper in the lamination direction.

2. The actuator according to claim 1, wherein the damper has an elastic compliance of $7\times10^{-17}$ $Pa^{-1}$ or more.

3. The actuator according to claim 1, wherein the damper has a Young's modulus of 3 GPa or more and 200 GPa or less.

4. The actuator according to claim 1, wherein the damper has a film stress of −200 MPa or more and 200 MPa or less.

5. The actuator according to claim 1, wherein the damper has a thickness of 2 µm or more and 10 µm or less.

6. The actuator according to claim 1, wherein materials of the multiple layers of the damper are selected from Si, Poly-Si, SiN, $SiO_2$, and $Al_2O_3$.

7. The actuator according to claim 1,
wherein the frame and the damper are bonded together.

8. The actuator according to claim 1,
wherein corresponding layers of the multiple layers with respect to the center in the lamination direction are formed of the same material and components.

9. The actuator according to claim 1,
wherein corresponding layers of the multiple layers with respect to the center in the lamination direction have the same thickness.

10. The actuator according to claim 1,
wherein a first thickness of an upper layer of the multiple layers is the same as a second thickness of a lower layer of the multiple layers,
where the upper layer is an upper portion of the multiple layers with respect to the center in the lamination direction, and
the lower layer is a lower portion of the multiple layers with respect to the center in the lamination direction.

11. A liquid discharge head comprising:
the actuator according to claim 1; and
a nozzle substrate bonded to the actuator substrate, the nozzle substrate including a nozzle, and
the actuator substrate includes an individual chamber communicating with the nozzle and the common chamber.

12. A liquid discharge device comprising the liquid discharge head according to claim 11.

13. The liquid discharge device according to claim 12, further comprising at least one of:
a head tank storing a liquid to be supplied to the liquid discharge head;
a carriage on which the liquid discharge head is mounted;
a supply mechanism configured to supply the liquid to the liquid discharge head;

a maintenance mechanism configured to maintain the liquid discharge head; or
a main scanning movement mechanism configured to move the liquid discharge head in a main scanning direction, combined together with the liquid discharge head to form a single body.

14. A liquid discharge apparatus comprising the liquid discharge device according to claim 12.

\* \* \* \* \*